United States Patent
Kjerrman et al.

(10) Patent No.: US 8,089,776 B2
(45) Date of Patent: Jan. 3, 2012

(54) SIDE SWITCH FOR A CONTACT EXPOSED ON AN EDGE OF A CIRCUIT BOARD AND METHOD

(75) Inventors: Tobias Kjerrman, Malmö (SE); Georgeta Anton, Dalby (SE); Pontus Bartilsson, Bunkeflostrand (SE); Paul Larsson, Malmö (SE); Mikael Hansson, Furulund (SE); Bengt Mattsson, Helsingborg (SE)

(73) Assignee: Sony Ericsson Mobile Communications AB, Lund (SE)

( * ) Notice: Subject to any disclaimer, the term of this patent is extended or adjusted under 35 U.S.C. 154(b) by 558 days.

(21) Appl. No.: 11/425,003

(22) Filed: Jun. 19, 2006

(65) Prior Publication Data

US 2007/0291456 A1 Dec. 20, 2007

(51) Int. Cl.
  *H05K 7/00* (2006.01)
(52) U.S. Cl. .................. 361/777; 361/807; 361/810
(58) Field of Classification Search .......... 361/777, 361/756, 760, 807, 810, 727, 737; 200/1 R, 200/5 R, 5 A, 51 R, 51.09, 51.1; 455/575.7, 455/73, 550.1, 575.1, 130, 347, 351, 78, 455/574, 572; 439/188
  See application file for complete search history.

(56) References Cited

U.S. PATENT DOCUMENTS

| | | | |
|---|---|---|---|
| 4,204,098 A | 5/1980 | Strande | |
| 4,291,210 A * | 9/1981 | Wolber et al. | 200/252 |
| 4,634,818 A | 1/1987 | Hayes-Pankhurst et al. | |
| 5,466,892 A * | 11/1995 | Howard et al. | 174/261 |
| 5,749,457 A * | 5/1998 | Castaneda et al. | 200/343 |
| 6,148,183 A * | 11/2000 | Higdon et al. | 455/575.1 |
| 6,466,769 B1 * | 10/2002 | Kobayashi et al. | 455/90.1 |
| 6,561,410 B2 * | 5/2003 | Dabral et al. | 228/178 |
| 6,590,778 B1 * | 7/2003 | Hojo et al. | 361/737 |
| 6,700,075 B2 * | 3/2004 | Gordon | 174/261 |
| 6,709,281 B2 | 3/2004 | Shishikura et al. | |
| 6,753,486 B2 * | 6/2004 | Matsui | 200/61.41 |
| 6,891,529 B2 | 5/2005 | Ladouceur et al. | |
| 6,906,273 B2 | 6/2005 | Searle et al. | |
| 6,961,593 B1 * | 11/2005 | Lonka et al. | 455/573 |
| 6,963,493 B2 | 11/2005 | Galvagni | |
| 6,995,322 B2 * | 2/2006 | Chan et al. | 174/262 |
| 7,154,196 B2 * | 12/2006 | Sparling et al. | 307/147 |

(Continued)

FOREIGN PATENT DOCUMENTS

| | | | |
|---|---|---|---|
| DE | 0070629 A2 * | 1/1983 | |
| EP | 0 739 058 A1 | 10/1996 | |
| EP | 1 120 802 A2 | 8/2001 | |

OTHER PUBLICATIONS

Thomas Brand, Single Pole Push Switch Using Elastomeric Actuator and Edge Plated PCB, Motorola Inc. Technical Developments, vol. 14, Dec. 1991.

(Continued)

*Primary Examiner* — Hung S Bui
(74) *Attorney, Agent, or Firm* — Renner, Otto, Boisselle & Sklar, LLP

(57) ABSTRACT

A switch configured to contact an exposed contact on an edge of a multilayer circuit board when selectively activated. The switch is particularly useful for electronic equipment such as mobile phones, PDA's, etc. where space for key contacts on the circuit board is limited. By facilitating connection to terminals formed on edges of a circuit board and/or edges of layers of multilayer circuit boards, the switch provides additional options for button locations on the electronic device heretofore requiring routing of wiring.

16 Claims, 3 Drawing Sheets

U.S. PATENT DOCUMENTS

| | | | |
|---|---|---|---|
| 7,388,394 B1 * | 6/2008 | Primavera et al. | 324/750.24 |
| 2003/0141174 A1 | 7/2003 | Matsui | |
| 2003/0221943 A1 * | 12/2003 | Masuda | 200/406 |
| 2005/0037671 A1 * | 2/2005 | Yamada et al. | 439/677 |
| 2005/0059281 A1 * | 3/2005 | Bricaud et al. | 439/188 |
| 2005/0272491 A1 | 12/2005 | Jeon | |
| 2005/0281010 A1 * | 12/2005 | Wang et al. | 361/752 |
| 2007/0039809 A1 * | 2/2007 | Aihara et al. | 200/310 |

OTHER PUBLICATIONS

International Search Report from International PCT Application No. PCT/IB2006/003733, filed Dec. 20, 2006.

Chinese Office Action of corresponding Chinese Application No. 200680055036.3, dated May 7, 2010.

* cited by examiner

SIDE SWITCH FOR A CONTACT EXPOSED ON AN EDGE OF A CIRCUIT BOARD AND METHOD

TECHNICAL FIELD OF THE INVENTION

The present invention relates generally to electronic equipment and, more particularly, to electronic equipment that includes circuit boards, and a method of providing a switch for contacting at least one exposed contact on an edge of a circuit board of an electronic equipment.

DESCRIPTION OF THE RELATED ART

Conventional mobile phones, in addition to providing voice communication capabilities, also provide a number of non-voice related features. For example, mobile phones can be used to surf the internet, transmit and receive messages (e.g., emails and text messages), play music and videos, take and display photographs, as well as a number of other features. The face of a mobile phone is typically consumed by a display and plurality of buttons for operating the phone.

In designing the physical characteristics of mobile phones, a number of considerations are taken into account. Two features of mobile phones that are highly desirable are the size of the mobile phone (generally a smaller phone is preferred) and the viewing area provided by the mobile phone's display (generally a larger viewing area is preferred). Accordingly, as the size of the phone is reduced the display constitutes a larger and larger portion of the phone, and the area available for buttons tends to decrease.

Displays are typically mounted on a circuit board housed within the phone. The typical circuit board contains most if not all of the phones electronic circuitry. For example, microprocessors, analog-to-digital and digital-to-analog conversion chips, ROM and flash memory chips, ports, an antenna, etc. In addition, the circuit board typically includes a plurality of keypad contacts (switches) with which the buttons of the phone interact when entering phone numbers and other data into the phone.

One type of keypad contact used for mobile phones is a dome switch. A dome switch generally includes a dome-shape resiliently deformable layer mounted over a pair of contacts (also referred to as terminals) on the surface of the circuit board. The dome-shape layer includes a conductive material positioned to contact the terminals when the dome-shape layer is deformed, such as when a button is depressed with a fingertip of a user. When the conductive material contacts the terminal, a circuit is completed thereby sending a signal to the microprocessor corresponding to the button pressed. These types of buttons are typically manipulated by a user's fingers and, as such, should be of a size, shape and/or orientation that promote ease of operation.

As phone sizes decrease and display sizes increase, the area available for keypad contacts on the circuit board and buttons on the face of the phone decreases. In dealing with the decrease in space, phone designers have decreased the size and/or quantity of buttons on the phone. Another alternative has been to place the buttons closer together. As buttons become smaller and/or closer together, however, they can become difficult to manipulate. Reducing the number of buttons typically reduces the functionality of the phone, or at least makes operating the phone more tedious.

SUMMARY

The present invention provides a switch, which may be disposed on an edge of a circuit board, configured to contact an exposed contact on an edge of a multilayer circuit board when selectively activated. The switch of the present invention is particularly useful for electronic equipment such as mobile phones, PDA's, etc. where space for key or button contacts on the circuit board is limited. By facilitating connection to terminals (contacts) formed on edges of circuit boards and/or edges of layers of multilayer circuit boards, the switch provides additional space for buttons on the electronic device heretofore typically required additional wiring and/or components. Accordingly, the present invention can also reduce labor associated with assembly of such electronic devices.

According to one aspect of the invention, there is provided an electronic equipment that includes a multilayer circuit board, each layer having conductive traces formed thereon, at least one contact exposed on an edge of a layer, and a switch activatable to selectively make mechanical and electrical contact with the exposed contact.

According to another aspect, the switch includes a resiliently deflectable portion configured to contact the at least one contact when deflected.

According to another aspect, the resiliently deflectable portion is deflectable along an axis extending in a direction including a component parallel to a direction in which the tabs compressively engage the circuit board.

According to another aspect, the resiliently deflectable portion includes a protrusion for making contact with the exposed contact.

According to another aspect, the electronic equipment includes a first securing tab and a second securing tab for securing the switch to the multilayer printed circuit board. The first and second securing tabs engage opposing sides of the multilayer printed circuit board.

According to another aspect, the first and second tabs compressively engage opposing sides of the multilayer printed circuit board.

According to another aspect, at least one of the first and second securing tabs includes a protrusion configured to mate with a recess on the circuit board for securing the switch thereto.

According to another aspect, the switch is generally c-shape in cross-section.

According to another aspect, the electronic equipment is a mobile phone.

According to another aspect, the electronic equipment is at least one of a personal audio device, a personal video device or a personal digital assistant.

Another aspect of the invention relates to a method of providing a switch for contacting at least one exposed contact on an edge of a multilayer circuit board of an electronic equipment including providing at least one terminal on an edge of the circuit board, and securing a switch to the edge of the circuit board such that the switch contacts the exposed contact when activated.

According to another aspect, the securing a switch includes securing a switch having a resiliently deflectable portion configured to contact the at least one contact when deflected.

According to another aspect, the securing includes aligning a protrusion extending from the resiliently deformable portion with the at least one terminal.

According to another aspect, the securing includes securing a first securing tab and a second securing tab to the multilayer printed circuit board, wherein the first and second securing tabs engage opposing sides of the multilayer printed circuit board.

According to another aspect, the securing further comprises orienting the switch such that the resiliently deflectable portion is deflectable along an axis extending in a direction including a component parallel to a direction in which the tabs compressively engage the circuit board.

According to another aspect, the providing at least one contact exposed on an edge of the circuit board includes providing the at least one contact on the edge of any layer of the multiplayer circuit board.

To the accomplishment of the foregoing and the related ends, the invention, then, comprises the features hereinafter fully described in the specification and particularly pointed out in the claims, the following description and the annexed drawings setting forth in detail certain illustrative embodiments of the invention, these being indicative, however, of but several of the various ways in which the principles of the invention may be suitably employed.

Other systems, methods, features, and advantages of the invention will be or become apparent to one with skill in the art upon examination of the following drawings and detailed description. It is intended that all such additional systems, methods, features, and advantages be included within this description, be within the scope of the present invention, and be protected by the accompanying claims.

Although the invention is shown and described with respect to one or more embodiments, it is to be understood that equivalents and modifications will occur to others skilled in the art upon the reading and understanding of the specification. The present invention includes all such equivalents and modifications, and is limited only by the scope of the claims.

Also, although the various features are described and are illustrated in respective drawings/embodiments, it will be appreciated that features of the given drawing or embodiment may be used in one or more other drawings or embodiments of the invention.

It should be emphasized that the term "comprise/comprising" when used in this specification is taken to specify the presence of stated features, integers, steps or components but does not preclude the presence or addition of one or more other features, integers, steps, components or groups thereof."

BRIEF DESCRIPTION OF THE DRAWINGS

Many aspects of the invention can be better understood with reference to the following drawings. The components in the drawings are not necessarily to scale, emphasis instead being placed upon clearly illustrating the principles of the present invention. Likewise, elements and features depicted in one drawing may be combined with elements and features depicted in additional drawings. Moreover, in the drawings, like reference numerals designate corresponding parts throughout the several views.

DETAILED DESCRIPTION OF EMBODIMENTS

Figure 1:
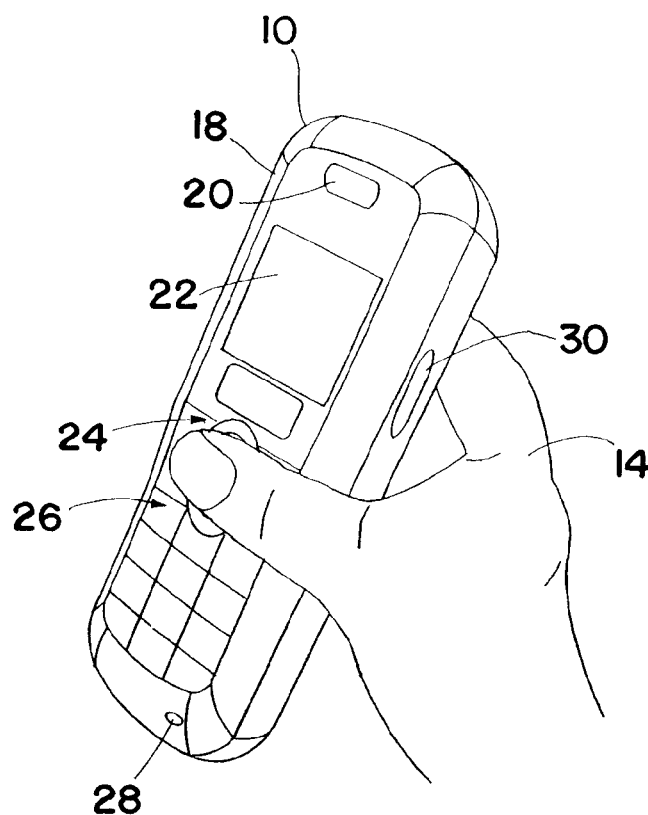
FIG. 1 is an illustration of an exemplary mobile phone.

The present invention will now be described with reference to the drawings, wherein like reference numerals are used to refer to like elements throughout.

The term "electronic equipment" includes portable radio communication equipment. The term "portable radio communication equipment," which hereinafter is referred to as a "mobile radio terminal," "mobile phone," "mobile device," or "mobile terminal" and the like, includes all equipment such as mobile telephones, pagers, communicators, i.e., electronic organizers, personal digital assistants (PDAs), smartphones, portable communication apparatus or the like. The term "electronic equipment" also may include portable digital music and/or video devices, e.g., iPod devices, mp3 players, etc.

In the present application, the invention is described primarily in the context of a mobile phone. However, it will be appreciated that the invention is not intended to be limited to a mobile phone and can be any type of electronic equipment.

Referring now to FIG. 1, a mobile phone 10 is shown as having a "brick" or "block" design type housing 18 (sometimes referred to as a case), but it will be appreciated that other type housings, such as, for example, clam shell or slide-type housings, may be utilized without departing from the scope of the invention. The mobile phone 10 further includes a speaker 20, display 22, a navigation switch and selection/function keys or switches 24, a key pad 26, a microphone 28, and a side switch 30; these are illustrative and exemplary of parts of a typical mobile phone, but it will be appreciated that other parts that are similar or different in form and/or function may be included in the mobile phone 10. The mobile phones to which the invention pertains also may be of the types that have more or fewer functions, keys, etc., compared to those illustrated and described herein.

As will be appreciated, the mobile phone 10 may function as a conventional mobile phone. The mobile phone 10 may have additional functions and capabilities that may be developed in the future. From a conventional point of view, the display 22 displays information to a user, such as operating state, time, phone numbers, contact information, various navigational menus, etc., which facilitate and/or enable the user to utilize the various features of the mobile phone. The display also may be used to view movies, images, or to play games, for example. Part or all of the display 22 may be a touch screen type device. The navigation and function keys 24 and the keypad 26 may be conventional in that they provide for a variety of user operations. For example, one or more of the function keys and navigation device 24 may be used to navigate through a menu displayed on the display 22 to select different phone functions, profiles, settings, etc., as is conventional. The keypad 26 typically includes one or more special function keys, such as, a "call send" key for initiating or answering a call, a "call end" key for ending or hanging up a call, and dialing keys for dialing a telephone number. Other keys included in the navigation and function keys 24 and/or keypad 26 may include an on/off power key, a web browser launch key, a camera key, a voice mail key, a calendar key, etc. The side switch 30 can be configured to perform any of a wide variety of functions. The specific function of the side switch 30 is not germane to the invention as will be appreciated.

Figure 2:
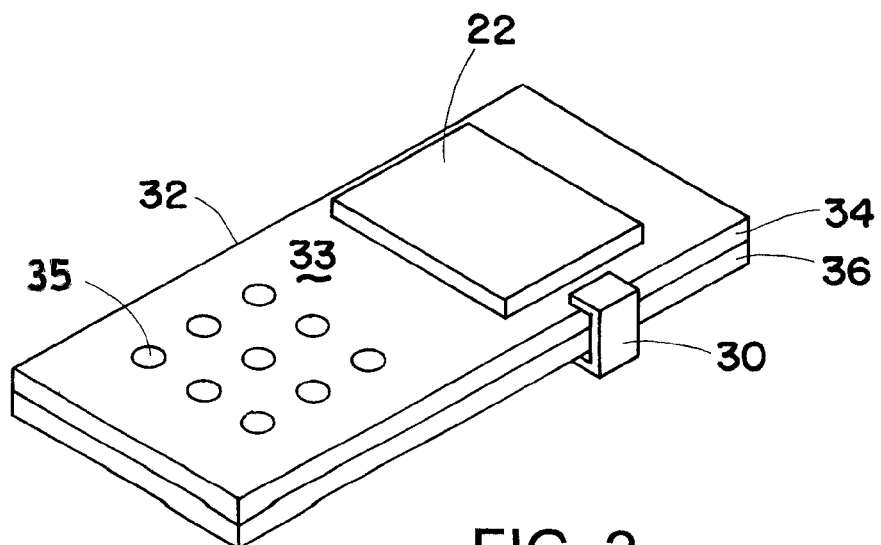
FIG. 2 is a perspective view of a circuit board of the respective mobile phone of FIG. 1.

FIG. 2 represents an exemplary circuit board 32 ordinarily positioned within the housing of a mobile phone, for example, the mobile phone 10. The representation also is similar to the circuit boards of PDAs and/or other electronic equipment, as will be appreciated by those having ordinary skill in the art. The circuit board 32 includes the display 22 mounted on a top surface 33 thereof, and a plurality of key contacts 35, which may be conventional dome switch type switches as previously described. The illustrated circuit board 32 is a multilayer circuit board consisting of two layers 34 and 36. It will be appreciated that the circuit board 32 may have any number of layers. Other components and details of the circuit board 32 have been omitted from FIG. 2 for clarity. The construction of the circuit board 32, which is presented by way of example here, is generally conventional with the exception of the functionalities provided by the side switch 30, which will be now be described.

Figure 3:
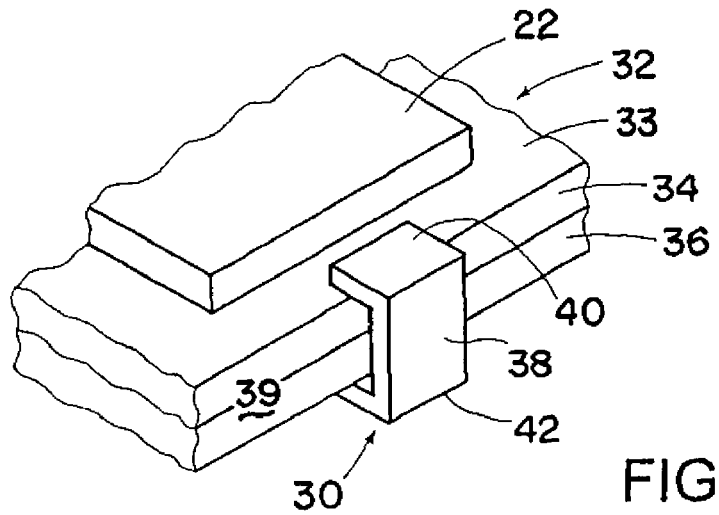
FIG. 3 is an enlarged view of a portion of the circuit board of FIG. 2 showing an exemplary side switch in accordance with the invention.
Figure 4:
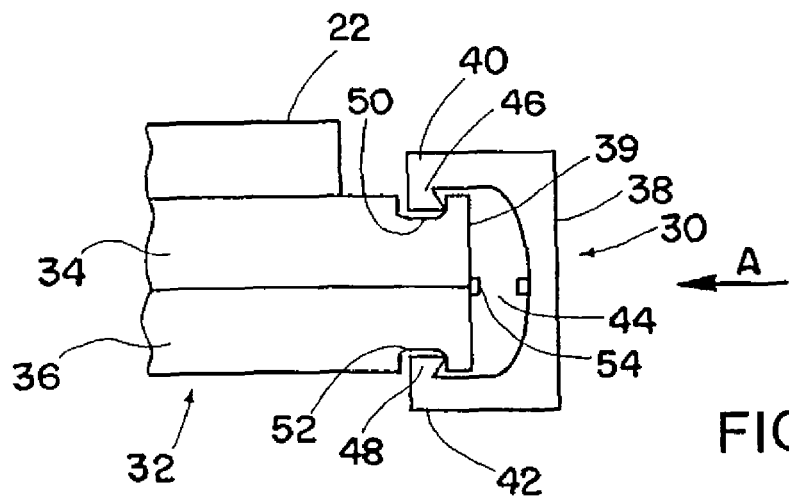
FIG. 4 is a cross-sectional view taken through the side switch of FIG. 3.

Turning to FIG. 3, the side switch 30 of FIG. 2 is shown in detail in accordance with an exemplary embodiment of the present invention. The side switch 30 has a generally c-shape cross-section (see FIG. 4) and includes a resiliently deflectable central portion 38 aligned with an edge 39 of the circuit board 32. An upper securing tab 40 and a lower securing tab 42 extend from the central portion 38 at generally right angles thereto and secure the side switch 30 to the circuit board 32. In general, the upper securing tab 40 and the lower securing tab 42 engage opposite sides of the circuit board 32, and can be configured to secure the side switch 30 to the circuit board 32 by compressively engaging the circuit board 32. In addition, and as best shown in FIG. 4, the securing tabs 40 and 42 include protrusions 46 and 48, respectively, that are received in recesses 50 and 52 in the circuit board 32 to provide a mechanical interlock between the side switch 30 and the circuit board 32. The protrusions 46 and 48 are optional and in some applications compressive engagement of the circuit board 32 by the securing tabs 40 and 42 is sufficient to secure the switch 30. The securing tabs 40 and 42 can optionally be provided with teeth or other gripping type structures to assist in securing the side switch 30 to the circuit board 32 with or without the recesses 50 and 52. It will be appreciated that the illustrated projections and recesses could be reversed, with the projections being provided on the circuit board 32 and the recesses being provided on the securing arms. Further, the side switch 30 of the present invention can be sized to fit virtually any thickness of multilayer circuit board.

The securing tabs 40 and 42 are sized and/or positioned to provide a gap 44 between the edge 39 of the circuit board 32 and the central portion 38 of the side switch 30 such that the switch 30, in its normal state, is not activated. To provide the gap 44, the securing tabs 40 and 42 may abut structure (not shown) on the circuit board 32 such that the securing tabs 40 and 42 are prevented from moving inwardly (i.e., towards the center of surface 33). Alternatively, the securing tabs 40 and 42 can include shoulders (not shown) that abut the edge 39 of the circuit board 32 when the switch 30 is mounted to the circuit board 32. Still another alternative, in embodiments having protrusions 46 and 48 and recesses 50 and 52, the position of the protrusions 46 and 48 relative to the position of the recesses 50 and 52 can be such so as to provide the gap 44. The gap 44 in the illustrated embodiments is exaggerated for clarity.

As mentioned, the central portion 38 of the side switch 30 is resiliently deformable such that with the application of pressure thereto, the central portion 38 will deflect thereby contacting an exposed contact 54 on the circuit board 32. The switch 30 can be made of a conductive material, or can be provided with a conductive material on an inner surface thereof for contacting the one or more exposed terminals 54 on the edge 39 of the circuit board 32 and/or a terminal, such as terminal 56 (as described herein) on upper surface 34. For example, the switch 30 can be made of copper or another metal capable of the resilient deformation. Flexible plastic could also be used with a foil adhesive strip provided for making contact with the terminals.

Figure 5:
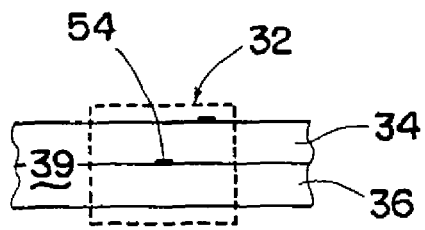
FIG. 5 is a side view of the side switch of FIG. 3, with the side switch shown in phantom.
Figure 6:
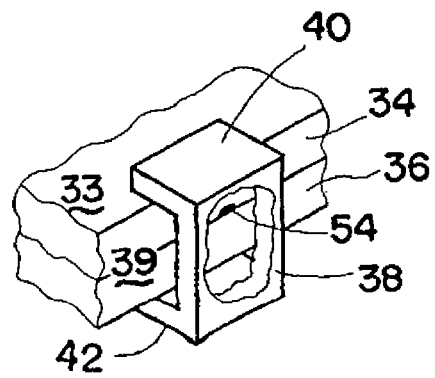
FIG. 6 is a perspective view of the side switch of FIG. 3, wherein a portion of the side switch has been removed to illustrate the location of an exposed contact.

The exposed contact 54, as illustrated in FIGS. 4-6, is exposed on the edge surface 39 of the multilayer circuit board 32. The contact 54 can be formed by extending a conductive trace to the edge of the circuit board layer on which it is formed, for example layer 36 in the illustrated example. In some applications, it can be advantageous to deposit or otherwise form conductive material on the edge 39 of the circuit board 32 to thereby enlarge the exposed contact 54. Alternatively, or in addition to enlarging the exposed contact 54, a protrusion 56 can be included on the central portion 38 of the side switch 30 for facilitating contact between the central portion 38 and the exposed contact 54.

It will be appreciated that a second exposed contact (not shown) can be provided adjacent to the illustrated exposed contact 54 on layer 36 (or on any other layer in the case of a multilayer circuit board). Accordingly, when deflected, the central portion 38 would contact both exposed contacts to thereby create a circuit. The side switch 30 could include another protrusion corresponding to the second exposed contact for facilitating contact therewith.

In the illustrated example, however, and with reference to FIGS. 5 and 6, a second contact 56 is disposed on an upper surface of layer 34 of the circuit board 32. Accordingly, the side switch 30 is typically in contact with the second contact 56, via securing tab 40, regardless of whether the central portion 38 is deflected. When deflected in the direction of arrow A in FIG. 5 (e.g., by pressure of a user's finger), the side switch 30 bows sufficiently to contacts the exposed contact 54 thereby completing a circuit and generating an electrical signal.

Figure 7:
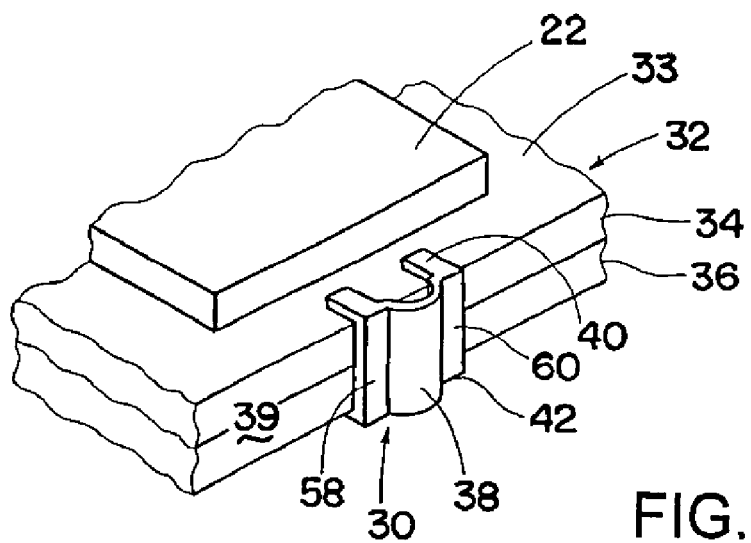
FIG. 7 is another exemplary side switch in accordance with the present invention.
Figure 8:
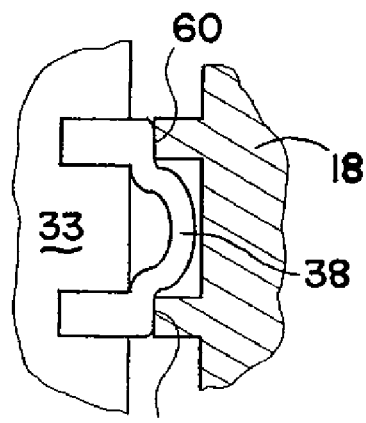
FIG. 8 is a top view of the side switch of FIG. 7.

Turning to FIGS. 7 and 8, another exemplary embodiment in accordance with the present invention is illustrated. In this embodiment, the side switch 30 is similar to the side switch 30 of FIGS. 1-6, except it includes bifurcated upper and lower securing tabs 40 and 42 and the central portion 38 is curved outwardly (away) from the edge 39 of the circuit board 32. Accordingly, in this embodiment the curvature of the central portion 38 maintains the gap 44 between the central portion 38 and the edge of the circuit board 32. Accordingly, edge portions 58 and 60 of the switch 30 in this embodiment can be flush with the edge 39 of the circuit board 32 as desired. Edge portions 58 and 60 can be used for securing the switch 30 to the circuit board 32 with an adhesive, for example. It will be appreciated that the securing tabs 40 and 42 also secure the side switch 30 to the circuit board 32 in a similar manner as previously described, by compressively engaging the circuit board 32 along an axis normal to the top surface 33 of the circuit board 33. Alternatively or additionally, the side switch 30 can be held in place on the circuit board 32 by adjacent structure, such as the housing 18 of the electronic equipment. In the illustrated example of FIG. 8, the housing 18 includes tabs 62 that engage edge portions 58 and 60 to secure the side switch 30 to the circuit board 32.

It will be appreciated that, due to its shape, the central portion 38 when deflected will flex about an axis normal to the upper surface 33 of the circuit board 32. Accordingly, the central portion 38 deflects about an axis extending in a direction including a component parallel to the direction in which the securing tabs 40 and 42 compressively engage the circuit board 32. In some applications, deflection about such an axis can be advantageous because it avoids the upper and lower securing tabs 40 and 42 from being spread apart in a direction that would lessen the compressive engagement of the circuit board 32, as may happen if the central portion 38 deflects about an axis that is not parallel to the direction in which the tabs 40 and 42 compressively engage the circuit board 32.

Figure 9:
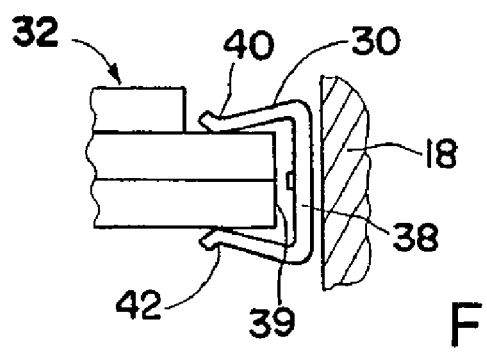
FIG. 9 is a side view of another exemplary side switch in accordance with the present invention.

Turning to FIG. 9, another exemplary side switch 30 in accordance with the present invention is illustrated. The side switch 30 has a generally c-shape cross-section and includes a resiliently deflectable central portion 38 aligned with an edge 39 of the circuit board 32. An upper securing tab 40 and a lower securing tab 42 extend from the central portion 38 and secure the side switch 30 to the circuit board 32. In general, the upper securing tab 40 and the lower securing tab 42 engage opposite sides of the circuit board 32, and can be configured to secure the side switch 30 to the circuit board 32 by compressively engaging the circuit board 32, as previously described. Alternatively or additionally, the side switch 30 can be secured in place on the circuit board 32 by adjacent structure, such as housing 18, which generally prevents the side switch 30 from sliding of the circuit board 32. As will be appreciated, the housing 18 can be provided with a resilient insert and/or button (not shown) for selectively activating the side switch 30.

It will now be appreciated that the present invention provides a switch that facilitates contacting an exposed contact on an edge of a multilayer circuit board when selectively activated. A resiliently deformable center portion of the switch can be deflected to make mechanical and electrical contact with the one or more exposed contacts on the circuit board edge. By providing a switch that can be used with exposed contacts on an edge of a circuit board (as opposed to a contacts on a face of a circuit board), the present invention is increases the space available for buttons on an electronic device. Accordingly, the invention is particularly useful for electronic equipment such as mobile phones, PDA's, etc. where space for key or button contacts on the circuit board is limited.

Specific embodiments of the invention have been disclosed herein. One of ordinary skill in the art will readily recognize that the invention may have other applications in other environments. In fact, many embodiments and implementations are possible. The following claims are in no way intended to limit the scope of the present invention to the specific embodiments described above. In addition, any recitation of "means for" is intended to evoke a means-plus-function reading of an element and a claim, whereas, any elements that do not specifically use the recitation "means for", are not intended to be read as means-plus-function elements, even if the claim otherwise includes the word "means".

Although the invention has been shown and described with respect to a certain preferred embodiment or embodiments, it is obvious that equivalent alterations and modifications will occur to others skilled in the art upon the reading and understanding of this specification and the annexed drawings. In particular regard to the various functions performed by the above described elements (components, assemblies, devices, compositions, etc.), the terms (including a reference to a "means") used to describe such elements are intended to correspond, unless otherwise indicated, to any element which performs the specified function of the described element (i.e., that is functionally equivalent), even though not structurally equivalent to the disclosed structure which performs the function in the herein illustrated exemplary embodiment or embodiments of the invention. In addition, while a particular feature of the invention may have been described above with respect to only one or more of several illustrated embodiments, such feature may be combined with one or more other features of the other embodiments, as may be desired and advantageous for any given or particular application.

What is claimed is:

1. An electronic equipment comprising:
   a multilayer circuit board including at least a first and second layer, each layer having conductive traces formed thereon, the conductive traces including at least one conductive trace formed on a non-exposed surface of the second layer;
   at least one contact exposed on an edge of the second layer, wherein the contact is formed by extending the at least one conductive trace on the non-exposed surface of the second layer to the edge of the second layer; and
   a switch secured to the circuit board and activatable to selectively make mechanical and electrical contact with the exposed contact.

2. The electronic equipment as set forth in claim 1, wherein the switch includes a resiliently deflectable portion configured to contact the at least one contact when deflected.

3. The electronic equipment as set forth in claim 2, wherein the resiliently deflectable portion includes a protrusion for making contact with the exposed contact.

4. The electronic equipment as set forth in claim 1, further comprising a first securing tab and a second securing tab for securing the switch to the multilayer printed circuit board, wherein the first and second securing tabs engage opposing sides of the multilayer printed circuit board.

5. The electronic equipment as set forth in claim 4, wherein the first and second tabs compressively engage opposing sides of the multilayer printed circuit board.

6. The electronic equipment as set forth in claim 4, wherein at least one of the first and second securing tabs includes a protrusion configured to mate with a recess on the circuit board for securing the switch thereto.

7. The electronic equipment as set forth in claim 1, wherein the switch is generally c-shape in cross-section.

8. The electronic equipment as set forth in claim 1, wherein the electronic equipment is a mobile phone.

9. The electronic equipment as set forth in claim 1, wherein the electronic equipment is at least one of a personal audio device, a personal video device or a personal digital assistant.

10. An electronic equipment comprising,
    a multilayer circuit board, each layer having conductive traces formed thereon;
    at least one contact exposed on an edge of a layer;
    a switch secured to the circuit board and activatable to selectively make mechanical and electrical contact with the exposed contact; and
    a first securing tab and a second securing tab for securing the switch to the multilayer printed circuit board, wherein the first and second securing tabs engage opposing sides of the multilayer printed circuit board,
    wherein the switch includes a resiliently deflectable portion configured to contact the at least one contact when deflected, and wherein the resiliently deflectable portion is deflectable along an axis extending in a direction including a component parallel to a direction in which the tabs compressively engage the circuit board.

11. A method of providing a switch on an edge of a multilayer circuit board of an electronic equipment, the multilayer circuit board including at least a first and second layer, each layer having conductive traces formed thereon, the conductive traces including at least one conductive trace formed on a non-exposed surface of the second layer, the method comprising:
    providing at least one contact exposed on an edge of the second layer by extending the at least one conductive trace on the non-exposed surface of the second layer to the edge of the second layer; and securing a switch to the edge of the circuit board such that the switch makes mechanical and electrical contact with the exposed contact when activate.

12. The method as set forth in claim 11, wherein the securing a switch includes securing a switch having a resiliently deflectable portion configured to contact the at least one contact when deflected.

13. The method as set forth in claim 12, wherein the securing includes aligning a protrusion extending from the resiliently deformable portion with the at least one contact.

14. The method as set forth in claim 11, wherein the securing includes securing a first securing tab and a second securing tab to the multilayer printed circuit board, wherein the first and second securing tabs engage opposing sides of the multilayer printed circuit board.

15. The method as set forth in claim 12, wherein the securing includes securing a first securing tab and a second securing tab to the multilayer printed circuit board, wherein the first and second securing tabs engage opposing sides of the multilayer printed circuit board, and wherein the securing further comprises orienting the switch such that the resiliently deflectable portion is deflectable along an axis extending in a direction including a component parallel to a direction in which the tabs compressively engage the circuit board.

16. The method as set forth in claim 11, wherein the providing at least one contact exposed on an edge of the circuit board includes providing the at least one contact on the edge of any layer of a multiplayer circuit board.

* * * * *